(12) United States Patent
Kim et al.

(10) Patent No.: US 9,685,492 B2
(45) Date of Patent: Jun. 20, 2017

(54) DISPLAY APPARATUS

(71) Applicant: SAMSUNG DISPLAY CO., LTD., Yongin, Gyeonggi-Do (KR)

(72) Inventors: Joonyoup Kim, Yongin (KR); Junho Choi, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/580,722

(22) Filed: Dec. 23, 2014

(65) Prior Publication Data

US 2016/0027859 A1    Jan. 28, 2016

(30) Foreign Application Priority Data

Jul. 24, 2014  (KR) .......................... 10-2014-0094151

(51) Int. Cl.
  *H01L 27/32* (2006.01)
  *H01L 51/52* (2006.01)

(52) U.S. Cl.
  CPC ...... *H01L 27/3267* (2013.01); *H01L 51/5218* (2013.01)

(58) Field of Classification Search
  None
  See application file for complete search history.

(56) References Cited

U.S. PATENT DOCUMENTS

| 7,027,113 B2 | 4/2006 | Kim et al. | |
| 7,687,983 B2* | 3/2010 | Lee | H01L 25/048 313/498 |
| 8,138,669 B2* | 3/2012 | Kim | H01L 25/048 313/505 |
| 8,421,343 B2 | 4/2013 | Kim | |
| 2004/0227159 A1* | 11/2004 | Nakashima | G09G 3/3225 257/202 |
| 2010/0201609 A1 | 8/2010 | Kim | |
| 2012/0299472 A1 | 11/2012 | Chung et al. | |

FOREIGN PATENT DOCUMENTS

| KR | 10-2005-0020332 A | 3/2005 |
| KR | 10-2005-0067804 A | 7/2005 |
| KR | 10-2009-0099744 A | 9/2009 |
| KR | 10-2010-0090448 A | 8/2010 |
| KR | 10-1152508 B1 | 5/2012 |

* cited by examiner

*Primary Examiner* — Andres Munoz
(74) *Attorney, Agent, or Firm* — Lee & Morse, P.C.

(57) ABSTRACT

A display apparatus includes a first substrate including a first display region and a first non-display region, a first display device in the first display region of the first substrate, a second substrate including a second display region and a second non-display region, the second display region overlapping the first non-display region of the first substrate, and a second display device in the second display region of the second substrate.

16 Claims, 6 Drawing Sheets

DISPLAY APPARATUS

CROSS-REFERENCE TO RELATED APPLICATION

Korean Patent Application No. 10-2014-0094151, filed on Jul. 24, 2014, in the Korean Intellectual Property Office, and entitled: "Display Apparatus," is incorporated by reference herein in its entirety.

BACKGROUND

1. Field

One or more embodiments relate to display apparatuses, and more particularly, to a display apparatus capable of performing a dual mirroring function and a dual displaying function.

2. Description of the Related Art

Display apparatuses have been recently replaced by thin flat panel display apparatuses that are portable. Display apparatuses capable of performing a mirroring function by external light reflection together with a display function have been recently proposed.

SUMMARY

According to one or more embodiments, a display apparatus includes a first substrate including a first display region and a first non-display region, a first display device in the first display region of the first substrate, a second substrate including a second display region and a second non-display region, the second display region overlapping the first non-display region of the first substrate, and a second display device in the second display region of the second substrate.

The display apparatus may further include a first reflection member that is disposed between the first substrate and the first display device and overlaps the first display device.

The display apparatus may further include a first driving circuit interposed between the first reflection member and the first display device.

The display apparatus may further include a first insulation layer formed between the first reflection member and the first driving circuit.

The display apparatus may further include a second reflection member that is disposed between the second substrate and the second display device and overlaps the second display device.

The display apparatus may further include a second driving circuit interposed between the second reflection member and the second display device.

The display apparatus may further include a second insulation layer formed between the second reflection member and the second driving circuit.

Each of the first display device and the second display device may include a first electrode, a second electrode opposite the first electrode, and an emission layer interposed between the first electrode and the second electrode.

The first electrode may be a reflection material, and the second electrode may be a transmissive material.

The display apparatus may further include a semi-transmission layer formed on a surface opposite a surface facing at least one of the first display device and the second display device from among surfaces of at least one of the first substrate and the second substrate.

The display apparatus may further include a color filter formed in at least one selected from the first non-display region of the first substrate and the second non-display region of the second substrate.

The display apparatus may further include a filling material interposed between the first substrate and the second substrate.

An image may be displayed on a side of the second substrate by light emitted from the first display device, and an image may be displayed on a side of the first substrate by light emitted from the second display device.

According to one or more embodiments of the present invention, a display apparatus includes a first substrate comprising a plurality of first display regions and a plurality of first non-display regions; at least one first pixel formed in the plurality of first display regions; a second substrate comprising a plurality of second display regions overlapping at least the first non-display regions of the first substrate and a plurality of second non-display regions; and at least one second pixel formed in the plurality of second display regions.

The display apparatus may further include a plurality of first reflection members that are disposed between the first substrate and the at least one first pixel and are formed in the plurality of first display regions of the first substrate.

The at least one first pixel may include a first driving circuit and a first display device, and the first driving circuit may be disposed between the first reflection member and the first display device and overlap the first display device.

The display apparatus may further include a first insulation layer formed between the first reflection member and the first driving circuit.

The display apparatus may further include a plurality of second reflection members that are disposed between the second substrate and the at least one second pixel and are formed in the plurality of second display regions of the second substrate.

The at least one second pixel may include a second driving circuit and a second display device, and the second driving circuit may be disposed between the second reflection member and the second display device and overlap the second display device.

The display apparatus may further include a second insulation layer formed between the second reflection member and the second driving circuit.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
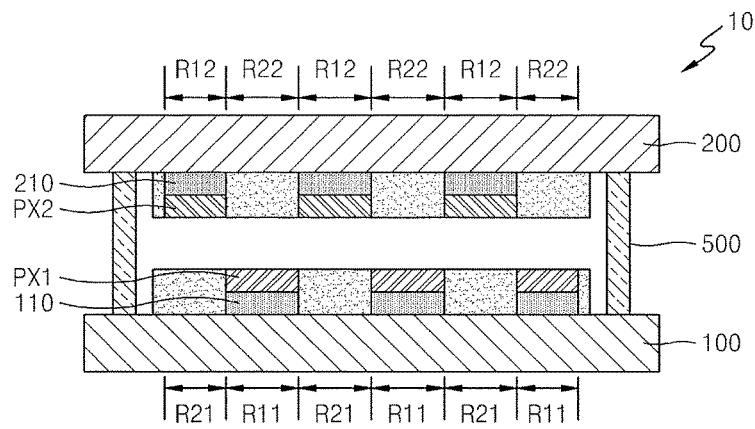
FIG. 1 illustrates a schematic cross-sectional view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Figure 2:
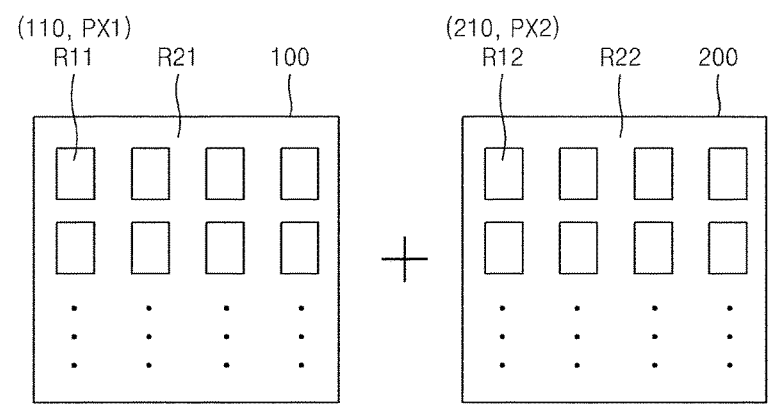
FIG. 2 illustrates a plan view for explaining bonding of a first substrate and a second substrate included in the display apparatus of FIG. 1.

FIG. 1 is a schematic cross-sectional view of a display apparatus 10 according to an embodiment. FIG. 2 is a plan view for explaining bonding of a first substrate 100 and a second substrate 200 included in the display apparatus 10 of FIG. 1.

Referring to FIGS. 1 and 2, the display apparatus 10 may include the first substrate 100 including a first reflection member 110 and a first pixel PX1 formed thereon, and the second substrate 200 including a second reflection member 210 and a second pixel PX2 formed thereon.

The first substrate 100 and the second substrate 200 may be formed of, e.g., a transparent glass material containing $SiO_2$ as a main component. However, the materials used to form the first substrate 100 and the second substrate 200 are not limited thereto, and the first substrate 100 and the second substrate 200 may be formed of a transparent plastic material.

A plurality of first display regions R11 and a plurality of first non-display regions R21 around the first display regions R11 are defined in the first substrate 100. At least one first pixel PX1 may be disposed on each of the first display regions R11. In each of the first display regions R11, a display device of at least one first pixel PX1 is disposed to emit light. The first non-display regions R21 do not emit light. At least one insulation layer is formed in the first non-display regions R21. The insulation layer of the first non-display regions R21 may be an organic layer and/or inorganic layer having a high transmittance. The insulation layer of the first non-display regions R21 may have a thickness that is suitable for light transmission. In other embodiments, the insulation layer of the first non-display regions R21 may not be used (e.g. may be removed), or the insulation layer of the first non-display regions R21 may have holes to transmit light emitted from a plurality of second display regions R12.

The first reflection member 110 and the first pixel PX1 corresponding to each other may be stacked in the first display region R11 on a first surface of the first substrate 100. The first pixel PX1 may include a display device or both a display device and a driving circuit. In the first display region R11, the driving circuit and the display device of the first pixel PX1 may be disposed to overlap with each other. The first pixel PX1 may be, for example, a red pixel, a green pixel, a blue pixel, or a white pixel.

The plurality of second display regions R12 and a plurality of second non-display regions R22 around the second display regions R12 are defined in the second substrate 200. At least one second pixel PX2 may be disposed on each of the second display regions R12. In each of the second display regions R12, a display device of at least one second pixel PX2 is disposed to emit light. The second non-display regions R22 do not emit light. At least one insulation layer is formed in the second non-display regions R22. The insulation layer in the second non-display regions R22 may be an organic layer and/or inorganic layer having a high transmittance. The insulation layer in the second non-display regions R22 may have a thickness that is suitable for light transmission. In other embodiments, the insulation layer in the second non-display regions R22 may not be used (e.g. may be removed), or the insulation layer in the second non-display regions R22 may have holes to transmit light emitted from the first display regions R11.

The second reflection member 210 and the second pixel PX2 corresponding to each other may be stacked in the second display region R12 on a first surface of the second substrate 200. The second pixel PX2 may include a display device or both a display device and a driving circuit. In the second display region R12, the driving circuit and the display device of the second pixel PX2 may be disposed to overlap each other. The second pixel PX2 may be, for example, a red pixel, a green pixel, a blue pixel, or a white pixel. The first surface of the second substrate 200 faces the first substrate 100.

The first substrate 100 and the second substrate 200 are bonded by a sealing member 500. To form the display apparatus 10, the first substrate 100 and the second substrate 200 having the same structures are sealed such that the respective first sides thereof face each other at a certain distance. In this case, the first substrate 100 and the second substrate 200 are arranged such that the second display regions R12 of the second substrate 200 overlap at least the first non-display regions R21 of the first substrate 100 and that the second non-display regions R22 of the second substrate 200 overlap at least the first display regions R11 of the first substrate 100. In other words, as illustrated in FIG. 1, the second display regions R12 of the second substrate 200 are offset relative to the first display regions R11 of the first substrate 100, so the first and second display regions R11 and R12 may have a non-overlapping relationship.

Figure 3:
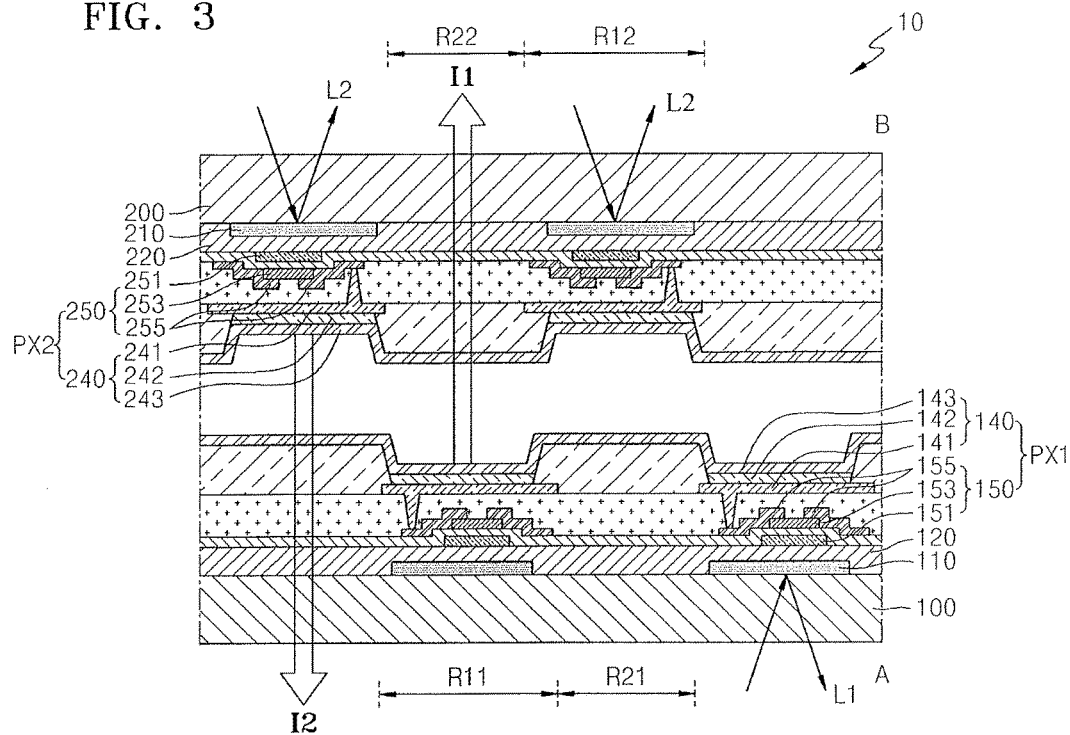
FIG. 3 illustrates a portion of a cross-section of FIG. 1 in greater detail.

FIG. 3 illustrates a portion of a cross-section of FIG. 1 in greater detail. Referring to FIG. 3, the display apparatus 10 includes the first substrate 100 and the second substrate 200.

As illustrated in FIG. 3, the first display region R11 of the first substrate 100 overlaps at least the second non-display region R22 of the second substrate 200. The first reflection member 110 and the first pixel PX1 are formed in the first display region R11 of the first substrate 100. The first reflection member 110 is disposed in the first display region R11 of the first substrate 100, and the first pixel PX1 overlaps the first reflection member 110. A first insulation layer 120 is disposed between the first pixel PX1 and the first reflection member 110.

The first reflection member 110 is formed of a reflection material. Accordingly, when seen from a first viewpoint A of FIG. 3, the first reflection member 110 operates like a mirror. The first reflection member 110 is disposed to face the second non-display region R22 of the second substrate 200 so as not to block the path of light emitted from the second pixel PX2 of the second substrate 200. The first reflection member 110 reflects incident external light L1 and thus operates like a mirror. External light L1 incident upon the first non-display region R21 of the first substrate 100 may be reflected by a reflection electrode of a second display device 240 of the second display region R12 of the second substrate 200. The first pixel PX1 is disposed on the first reflection member 110 such as to overlap the first reflection member 110.

The first pixel PX1 may include a first driving circuit 150 and a first display device 140. The first driving circuit 150 is disposed below the first display device 140 such as to overlap the first display device 140. The first driving circuit 150 is disposed between the first reflection member 110 and the first display device 140. The first driving circuit 150 may include at least one thin film transistor and a capacitor. For convenience of explanation, FIG. 3 illustrates one thin film transistor of the first driving circuit 150. The thin film transistor includes a gate electrode 151, an active layer 153, and source/drain electrodes 155. The first display device 140 may be an organic light-emitting diode (OLED) including a first electrode 141, an organic emission layer 142, and a second electrode 143 opposite to the first electrode 141. The first driving circuit 150 may drive the first display device 140 in response to an electrical signal received from an external source.

The first pixel PX1 is insulated from the first reflection member 110 by the first insulation layer 120. The first insulation layer 120 may have a sufficient thickness to prevent generation of parasitic capacitance between the first reflection member 110 and one electrode of the first pixel PX1, e.g., one electrode of the first display device 140 or one electrode of the first driving circuit 150. For example, the first insulation layer 120 may be a transparent organic insulation layer having a thickness of about 2 µm or more.

The first pixel PX1 faces the second non-display region R22 of the second substrate 200 and, when seen from a second viewpoint B, provides an image I1 by emitting light in a direction oriented away from the first substrate 100.

The second display region R12 of the second substrate 200 overlaps at least the first non-display region R21 of the first substrate 100. In the second display region R12 of the second substrate 200, the second reflection member 210 and the second pixel PX2 are formed. The second reflection member 210 is disposed in the second display region R12 of the second substrate 200, and the second pixel PX2 overlaps the second reflection member 210 with a second insulation layer 220 interposed therebetween.

The second reflection member 210 is formed of a reflection material to perform a mirroring function from the second viewpoint B of FIG. 3. The second reflection member 210 is disposed to face the first non-display region R21 of the first substrate 100 so as to not block the path of light emitted from the first pixel PX1 of the first substrate 100. The second reflection member 210 reflects incident external light L2 and thus operates like a mirror. External light L2 incident upon the second non-display region R22 of the second substrate 200 may be reflected by a reflection electrode of the first display device 140 of the first display region R11 on the first substrate 100. The second pixel PX2 is disposed on the second reflection member 210 such as to overlap the second reflection member 210.

The second pixel PX2 may include a second driving circuit 250 and the second display device 240. The second driving circuit 250 is disposed below the second display device 240 such as to overlap the second display device 240. The second driving circuit 250 is disposed between the second reflection member 210 and the second display device 240. The second driving circuit 250 may include at least one thin film transistor and a capacitor. For convenience of explanation, FIG. 3 illustrates one thin film transistor of the second driving circuit 250. The thin film transistor includes a gate electrode 251, an active layer 253, and source/drain electrodes 255. The second display device 240 may be an OLED including a first electrode 241, an organic emission layer 242, and the second electrode 243 opposite to the first electrode 241. The second driving circuit 250 may drive the second display device 240 in response to an electrical signal received from an external source.

The second pixel PX2 is insulated from the second reflection member 210 by the second insulation layer 220. The second insulation layer 220 may have a sufficient thickness to prevent generation of parasitic capacitance between the second reflection member 210 and one electrode of the second pixel PX2, e.g., one electrode of the second display device 240 or one electrode of the second driving circuit 250. For example, the second insulation layer 220 may be a transparent organic insulation layer having a thickness of about 2 µm or more.

The second pixel PX2 faces the first non-display region R21 of the first substrate 100 and provides, when seen from the first viewpoint A, an image I2 by emitting light in a direction oriented away from the second substrate 200.

The first reflection member 110 and the second reflection member 210 may be formed of a reflector capable of reflecting incident external light, e.g., the first and second reflection members 110 and 210 may be formed of a predetermined metal. For example, the first reflection member 110 and the second reflection member 210 may include aluminum (Al), chromium (Cr), silver (Ag), iron (Fe), platinum (Pt), mercury (Hg), nickel (Ni), tungsten (W), vanadium (V), and/or molybdenum (Mo). In another example, each of the first reflection member 110 and the second reflection member 210 may be formed of a plurality of layers in which metal, e.g., a single metal layer, is interposed between transparent conductive metal oxides.

Each of the first reflection member 110 and the second reflection member 210 has suitable reflectance. The first reflection member 110 has reflectance that is similar to or the same as that of the second pixel PX2. The second reflection member 210 has reflectance that is similar to or the same as that of the first pixel PX1. A reflectance difference between the first reflection member 110 and the second pixel PX2 and a reflectance difference between the second reflection member 210 and the first pixel PX1 may be about 10% or less. Accordingly, the display apparatus 10 may perform both an image display function and a mirroring function. Each of the first reflection member 110 and the second reflection member 210 has a suitable thickness according to the reflectance thereof.

When the first pixel PX1 formed on the first substrate 100 is driven, the image I1 is obtained on side B of the second substrate 200, and the first substrate 100 performs a mirroring function by reflecting the external light L1 incident from side A of the first substrate 100 by using the first reflection member 110. When the first pixel PX1 formed on the first substrate 100 is not driven, no images are displayed on the second substrate 200, and the second substrate 200 performs a mirroring function by reflecting the external light L2 incident from side B of the second substrate 200 by using the second reflection member 210.

When the second pixel PX2 formed on the second substrate 200 is driven, the image I2 is displayed on side A of the first substrate 100, and the second substrate 200 performs a mirroring function by reflecting the external light L2 incident from side B of the second substrate 200 by using the second reflection member 210. When the second pixel PX2 formed on the second substrate 200 is not driven, no images are displayed on the first substrate 100, and the first substrate 100 performs a mirroring function by reflecting the external light L1 incident from side A of the first substrate 100 by using the first reflection member 110.

The first pixel PX1 and the second pixel PX2 may be driven independently, and image display and mirroring may be performed independently on side A of the first substrate 100 and on side B of the second substrate 200, respectively. As illustrated in FIG. 3, sides A and B refer to opposite external sides of the display.

FIGS. 4-8 are schematic cross-sectional views illustrating stages in a method of manufacturing the display apparatus of FIGS. 1-3 according to an embodiment.

Figure 4:
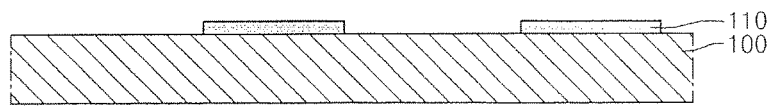
FIGS. 4-8 illustrate schematic cross-sectional views illustrating stages in a method of manufacturing a display apparatus according to an embodiment.

Referring to FIG. 4, the first reflection members 110 are formed in the first display regions R11 by forming a first conductive layer on the first substrate 100 via deposition and then patterning the first conductive layer. Alternatively, the first reflection members 110 may be formed directly in the first display regions R11 by using a mask.

The first reflection members 110 are formed in the first display regions R11, which are regions where first pixels PX1 are to be formed later. The first conductive layer may contain, e.g., aluminum (Al), chromium (Cr), silver (Ag), iron (Fe), platinum (Pt), mercury (Hg), nickel (Ni), tungsten (W), vanadium (V), or molybdenum (Mo).

Figure 5:
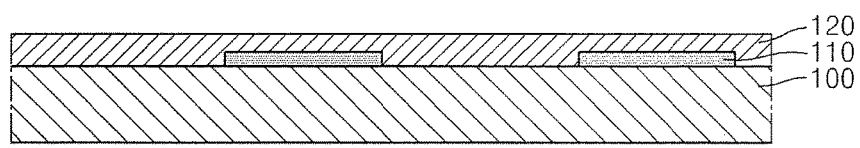

Referring to FIG. 5, the first insulation layer 120 is formed on the first substrate 100 on which the first reflection members 110 have been formed. The first insulation layer 120 may be an organic insulation layer. The first insulation layer 120 may have a thickness sufficient to minimize (or prevent) occurrence of an electrical interference, e.g., parasitic capacitance, between one electrode of a thin film transistor which will be formed later and each of the first reflection members 110. The first insulation layer 120 may include a material having high transmittance to transmit light emitted from the second pixels PX2. The first insulation layer 120 may include transparent acrylic, transparent BenzoCycloButene (BCB), transparent polyimide, or the like.

Figure 6:
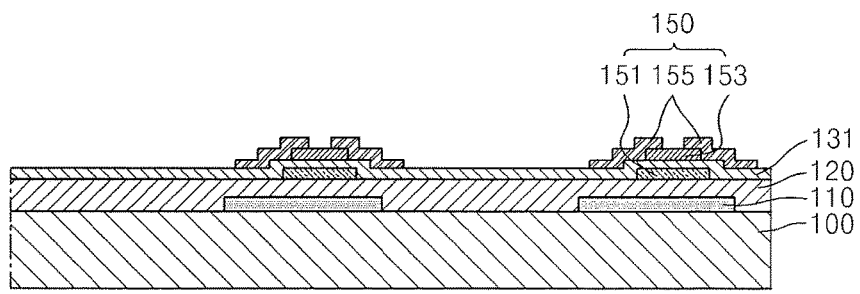

Referring to FIG. 6, the first driving circuits 150 are formed on the first insulation layer 120. FIG. 6 illustrates one thin film transistor as each of the first driving circuits 150. The thin film transistor may include the gate electrode 151, the active layer 153, and the source/drain electrodes 155. Each of the first driving circuits 150 including the thin film transistor is formed in a corresponding first display region R11 and overlaps a corresponding first reflection member 110.

The gate electrode 151 may include at least one of Ag, Mg, Al, Pt, Pd, Au, Ni, Nd, Ir, Cr, Li, Ca, Mo, Ti, W, MoW, and Cu. However, the material used to form the gate electrode 151 is not limited thereto, and the gate electrode 151 may be formed of any suitable material in consideration of adhesion with an adjacent layer, smoothness, electrical resistance, and processability. The gate electrode 151 may be a single layer or a stack of layers.

A single-layered or multi-layered insulation layer 131 may be formed of a transparent organic material and/or a transparent inorganic material on an upper surface of the gate electrode 151, to serve as a gate insulating layer. The transparent organic material may include transparent acryl, BCB, polyimide, or the like. The transparent inorganic material may include silicon nitride ($SiN_x$), silicon oxide ($SiO_2$), amorphous silicon (a-Si), or the like.

The active layer 153 may be formed of an inorganic semiconductor, e.g., amorphous silicon or polysilicon, an oxide semiconductor, or an organic semiconductor. The active layer 153 includes a source region doped with impurities, a drain region doped with impurities, and a channel region interposed between the source and drain regions.

The source and drain electrodes 155 may be formed of the same conductive material as that used to form the gate electrode 151, but are not limited thereto. The source and drain electrodes 155 may be formed of any of various conductive materials and each may have a single-layer structure or a multi-layer structure. The source and drain electrodes 155 contact the source and drain regions of the active layer 153.

The structure of the thin film transistor illustrated in FIG. 6 is an example, and embodiments are not limited thereto.

Figure 7:
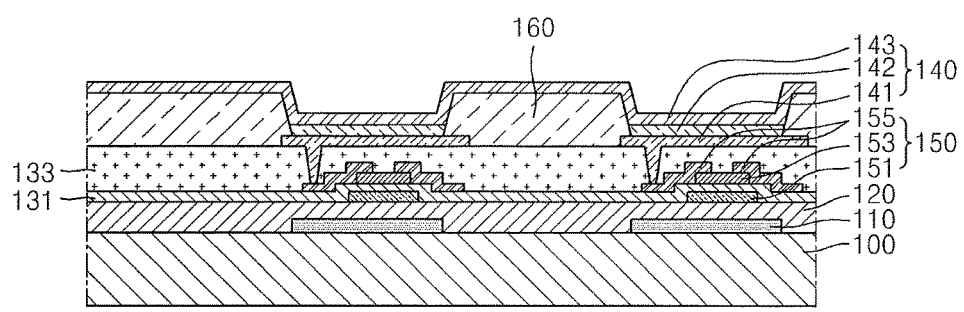

Referring to FIG. 7, first display devices 140 are formed on the first substrate 100 on which the first driving circuits 150 have been formed. The first display devices 140 overlap the first reflection members 110 and the first driving circuits 150.

An insulation layer 133 is formed of an organic material and/or an inorganic material on the first substrate 100 to have a single layer or multi-layer structure. The insulation layer 133 may be formed of a transparent organic material and/or a transparent inorganic material to have a single layer or multi-layer structure. A via hole that exposes one of the source and drain electrodes 155 is formed in the insulation layer 133.

First electrodes 141 are formed on the insulation layer 133. The first electrodes 141 may be electrically connected to the thin film transistors via the via holes. The first electrodes 141 may be reflection electrodes. Each of the first electrodes 141 may be an electrode layer including a reflection material, or may be formed by forming a reflection layer including a reflection material and then forming an electrode layer including a transparent material on the reflection layer. The reflection material may at least one of Ag, Mg, Al, Pt, Pd, Au, Ni, Nd, Ir, Cr, Li, Ca, LiF/Ca, LiF/Al, and/or a combination thereof. The transparent material may be, e.g., ITO, IZO, ZnO, and/or $In_2O_3$.

An insulation layer 160 is formed on the first substrate 100 on which the first electrodes 141 have been formed, and is patterned such that upper surfaces of the first electrodes 141 are exposed. The insulation layer 160 is patterned to cover ends of each of the first electrodes 141, thereby serving as a pixel defining layer. Similar to the insulation layer 133, the insulation layer 160 may also be formed of a transparent organic material and/or a transparent inorganic material to have a single layer or multi-layer structure.

Organic emission layers 142 are formed on the first electrodes 141, and the second electrode 143 is formed on the entire surface of the first substrate 100. The second electrode 143 may be a transparent electrode including a transparent material, i.e., a transmissive material. The second electrode 143 may be formed thinly in consideration of light transmittance. The second electrode 143 may be a continuous electrode overlapping the plurality of first electrodes 141, or may be patterned to have separate portions included only in the first display regions R11 to correspond to respective first electrodes 141.

Although not illustrated in the drawings, at least one of a hole injection layer (HIL), a hole transport layer (HTL), an electron transport layer (ETL), and an electron injection layer (EIL), in addition to the organic emissive layer 142, may be further included between the first and second electrodes 141 and 143. The present embodiment is not limited thereto, and various other functional layers may be further included therebetween.

Figure 8:
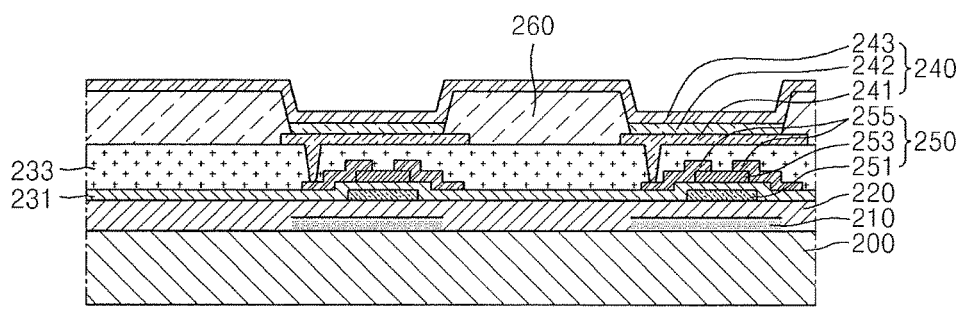

Referring to FIG. 8, similar to FIGS. 4-7, second reflection members 210, second driving circuits 250, and second display diodes 240 are formed on the second substrate 200. A repeated description of components described above with reference to FIGS. 4-7 will be omitted.

The second reflection members 210 are formed in the second display regions R12 of the second substrate 200. The second insulation layer 220 is formed on the second substrate 200 on which the second reflection members 210 have been formed. The second insulation layer 220 may be an organic insulation layer having a thickness sufficient to minimize (or prevent) generation of parasitic capacitance between one electrode of a thin film transistor which will be formed later and each of the second reflection members 210.

The second driving circuits 250 overlapping the second reflection members 210 are formed on the second insulation layer 210. A thin film transistor as a circuit device of each of the second driving circuits 250 may include the gate electrode 251, the active layer 253, the source electrode 255, and the drain electrode 255. A single-layered or multi-layered insulation layer 231 may be formed of a transparent organic material and/or a transparent inorganic material between the gate electrode 251 ad the active layer 253, to serve as a gate insulation layer.

An insulation layer 233 is formed on the second substrate 200 on which the second driving circuits 250 have been formed. The second display devices 240 overlapping the second reflection members 210 and the second driving circuits 250 are formed on the second substrate 200 on which the insulation layer 233 has been formed.

The first electrodes 241 may be formed on the insulation layer 233 and may be electrically connected to the thin film transistors below the first electrodes 241 via via holes formed in the insulation layer 233. The first electrodes 241 are exposed by forming the insulation layer 260 on the first electrodes 241 and patterning the insulation layer 260. The insulation layer 260 is patterned to cover ends of each of the first electrodes 241, thereby serving as a pixel defining layer.

The organic emission layers 242 are formed on the first electrodes 242, and the second electrode 243 is formed on the entire surface of the second substrate 200.

Then, the first substrate 100 and the second substrate 200 formed according to the same process are aligned with each other and bonded together. As described above, the first substrate 100 and the second substrate 200 are arranged such that the first display regions R11 of the first substrate 100 overlap the second non-display regions R22 of the second substrate 200, and the first non-display regions R12 of the first substrate 100 overlap the second display regions R21 of the second substrate 200. Accordingly, the display apparatus 10 may perform both a dual display function and a dual mirroring function.

Figure 9:
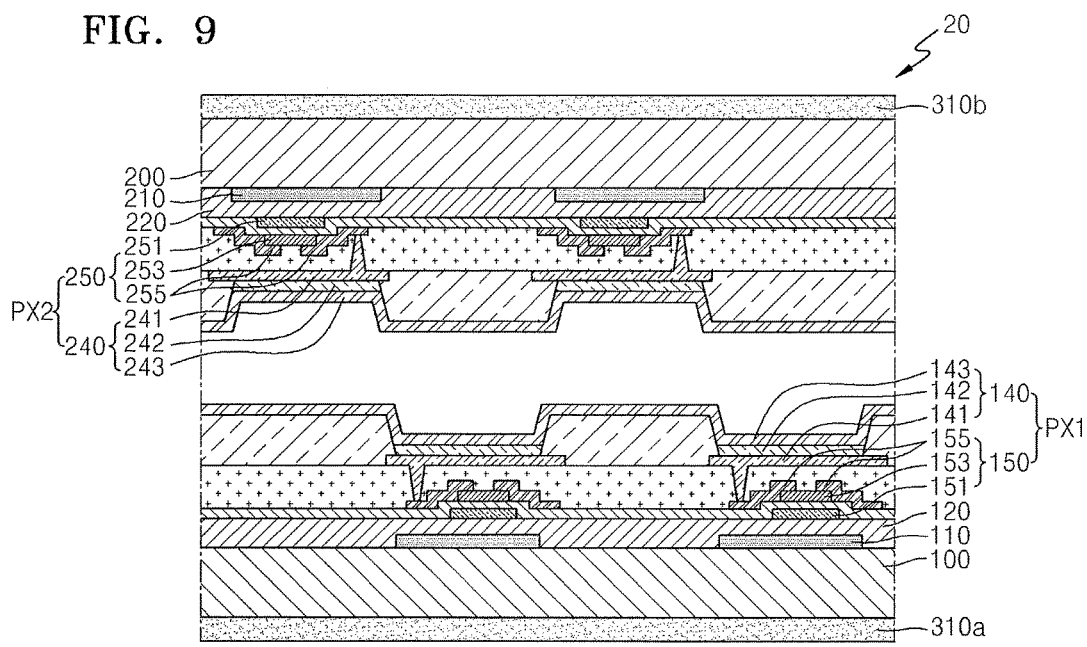
FIGS. 9-11 illustrate cross-sectional views of display apparatuses according to other embodiments.

FIG. 9 is a cross-sectional view of a display apparatus 20 according to another embodiment. A description of components that are the same as those of the display apparatus 10 of FIGS. 1-8 will be omitted, and the display apparatus 20 will now be described by focusing on differences between the display apparatuses 10 and 20.

Referring to FIG. 9, the display apparatus 20 further includes a semi-transmission layer formed on a surface opposite to a surface facing at least one of the first pixel PX1 and the second pixel PX2 or a surface facing at least one of the first reflection member 110 and the second reflection member 210 from among the surfaces of at least one of the first substrate 100 and the second substrate 200.

In detail, the display apparatus 20 further includes a first semi-transmission layer 310a and a second semi-transmission layer 310b respectively formed on outer surfaces of the first substrate 100 and the second substrate 200 in addition to the components of the display apparatus 10 of FIG. 3. The first semi-transmission layer 310a and the second semi-transmission layer 310b may contribute to improving the quality of refection.

Alternatively, the first semi-transmission layer 310a may be patterned to be formed only in the first non-display regions R21, and the second semi-transmission layer 310b may be patterned to be formed only in the second non-display regions R22. In this case, reflectance of the first reflection member 110 and reflectance of the first semi-transmission layer 310a may be set such that reflectance obtained by the first reflection member 110 is the same as or similar to reflectance obtained by the first semi-transmission layer 310a and the second pixel PX2, and reflectance of the second reflection member 210 and reflectance of the second semi-transmission layer 310b may be set such that reflectance obtained by the second reflection member 210 is the same as or similar to reflectance obtained by the second semi-transmission layer 310b and the first pixel PX1.

Figure 10:
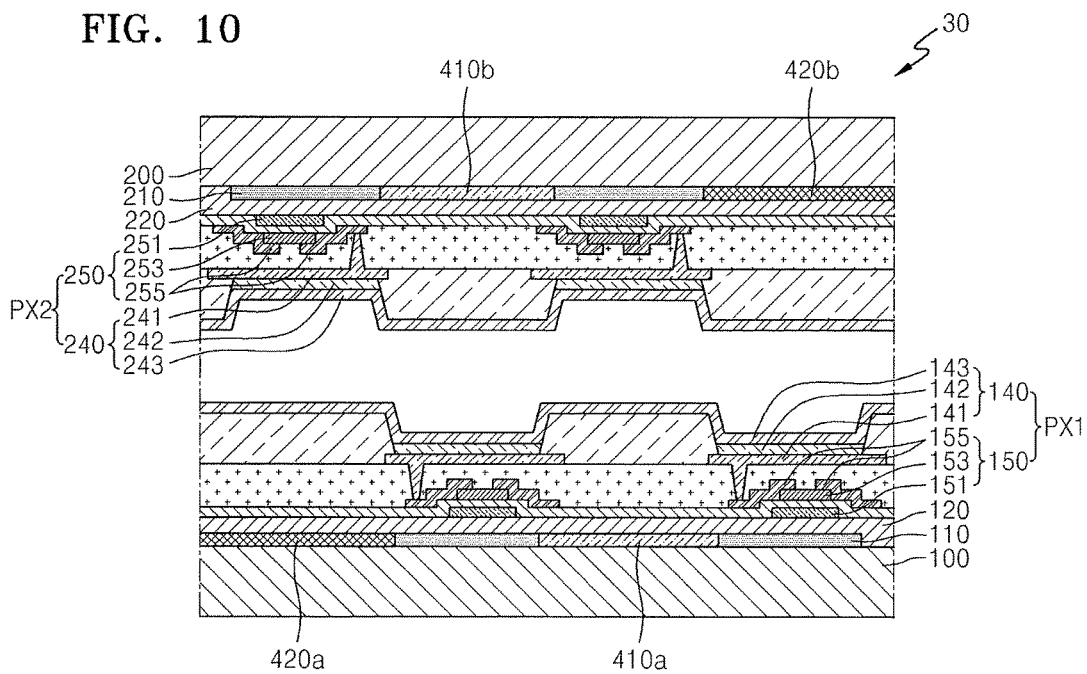

FIG. 10 is a cross-sectional view of a display apparatus 30 according to another embodiment. A description of components that are the same as those of the display apparatus 10 of FIGS. 1-8 will be omitted, and the display apparatus 30 will now be described by focusing on differences between the display apparatuses 10 and 30.

Referring to FIG. 3, the display apparatus 30 may further include a color filter formed in at least one of the first non-display region R21 of the first substrate 100 and the second non-display region R22 of the second substrate 200 in addition to the components of the display apparatus 10 of FIG. 3.

Referring to FIG. 10, the display apparatus 30 further includes first color filters 410a and 420a formed in the first non-display regions R21 of the first substrate 100, and second color filters 410b and 420b formed in the second non-display regions R22 of the second substrate 200.

When images are simultaneously displayed on side A of the first substrate 100 and side B of the second substrate 200, interference between light emitted from the first pixel PX1 and light emitted from the second pixel PX2 may occur. In addition, when external light incident upon side A of the first substrate 100 and external light incident upon side B of the second substrate 200 are reflected by pixels respectively formed on the second and first substrates 200 and 100, the external lights are diffusely reflected, thereby leading to a reduction in a reflection property.

The second color filters 410b and 420b corresponding to colors of the first pixels PX1 may be formed in the second non-display regions R22 of the second substrate 200, and the first color filters 410a and 420a corresponding to colors of the second pixels PX2 may be formed in the first non-display regions R21 of the first substrate 100, to thereby improve a display quality and a reflection property.

Figure 11:
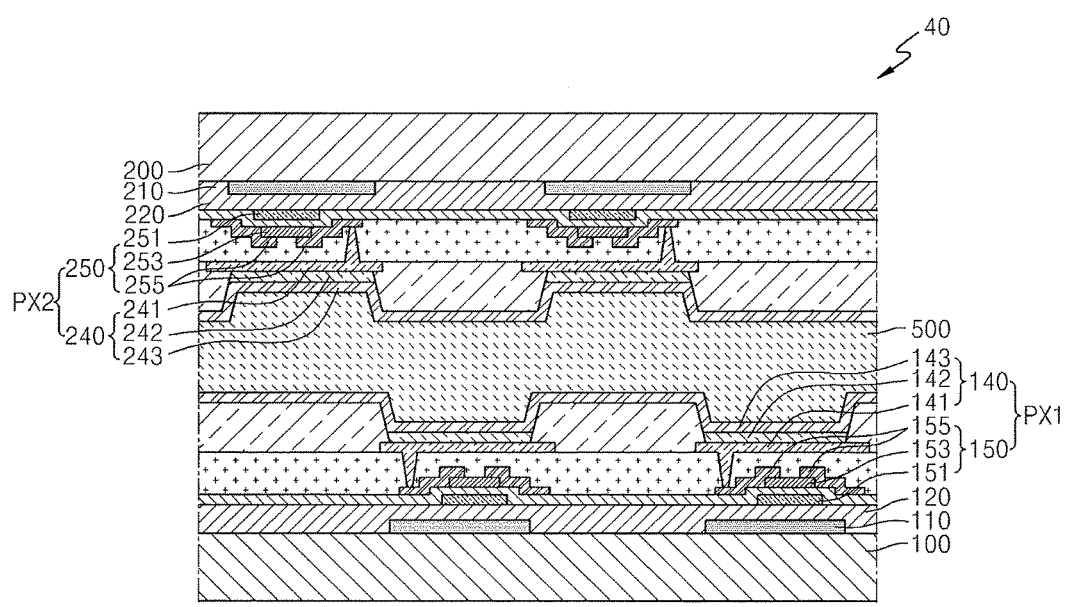

FIG. 11 is a cross-sectional view of a display apparatus 40 according to another embodiment. A description of components that are the same as those of the display apparatus 10 of FIGS. 1-8 will be omitted, and the display apparatus 40 will now be described by focusing on differences between the display apparatuses 10 and 40.

Referring to FIG. 11, the display apparatus 40 further includes a filling material 500 between the first substrate 100 and the second substrate 200 in addition to the components of the display apparatus 10 of FIG. 3. Due to the filling material 500, a gap between the first substrate 100 and the second substrate 200 is constant and reduction of reflection is prevented from occurring when the first substrate 100 or the second substrate 200 is bent by an external pressure. Thus, a reflection property and a display quality may improve. The filling material 500 contains a transmissive transparent material.

Although an insulation layer is formed of a transparent inorganic material and/or transparent organic material that is transmissive with respect to light in non-display regions, and is formed on the entire surface of a substrate to have a predetermined thickness in the above-described embodiments, the embodiments are not limited thereto. For example, portions of the insulation layer in the non-display regions may be removed by patterning. In another example, portions of a second electrode in the non-display regions may also be removed out by patterning.

Although a display apparatus including an OLED is illustrated in the above-described embodiments, the embodiments are not limited thereto. For example, various display apparatuses, e.g., a liquid crystal display device, may be used.

By way of summation and review, a conventional display apparatus capable of performing a mirroring function and a display function by using liquid crystal displays with semi-transmission mirrors has been proposed. However, due to the use of a semi-transmission mirror, the amount of light that is transmitted is reduced, thus leading to decreases in transmittance and reflectance. In contrast, in accordance with the exemplary embodiments, a display apparatus capable of achieving a mirror function on both surfaces thereof and simultaneously displaying images on both surfaces thereof, without degrading a reflection property and a display quality, may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a first substrate including a first display region and a first non-display region;
a first display device in the first display region of the first substrate;
a first reflection member between the first substrate and the first display device, the first reflection member overlapping the first display device;
a second substrate including a second display region and a second non-display region, the second display region overlapping the first non-display region of the first substrate;
a second display device in the second display region of the second substrate;
a second reflection member between the second substrate and the second display device, the second reflection member overlapping the second display device; and
wherein:
the first display device includes a first electrode, a first emission layer, and a second electrode sequentially positioned from the first substrate,
the second display device includes a third electrode, a second emission layer, and a fourth electrode sequentially positioned from the second substrate,
the first emission layer does not overlap with the second emission layer, and
the first electrode and the third electrode include a reflection material, and the second electrode and the fourth electrode include a transparent material.

2. The display apparatus as claimed in claim 1, further comprising a first driving circuit between the first reflection member and the first display device.

3. The display apparatus as claimed in claim 2, further comprising a first insulation layer between the first reflection member and the first driving circuit.

4. The display apparatus as claimed in claim 1, further comprising a second driving circuit between the second reflection member and the second display device.

5. The display apparatus as claimed in claim 4, further comprising a second insulation layer between the second reflection member and the second driving circuit.

6. The display apparatus as claimed in claim 1, further comprising a semi-transmission layer on a surface opposite a surface facing at least one of the first display device and the second display device from among surfaces of at least one of the first substrate and the second substrate.

7. The display apparatus as claimed in claim 1, further comprising a color filter in at least one of the first non-display region of the first substrate and the second non-display region of the second substrate.

8. The display apparatus as claimed in claim 1, wherein:
an image is displayed on a side of the second substrate by light emitted from the first display device, and
an image is displayed on a side of the first substrate by light emitted from the second display device.

9. The display apparatus as claimed in claim 1, wherein the first electrode of the first display device is electrically connected to a first driving circuit between the first reflection member and the first display device, and the third electrode of the second display device is electrically connected to a second driving circuit between the second reflection member and the second display device.

10. A display apparatus, comprising:
a first substrate including a first display regions and a plurality of first non-display regions;
a plurality of first pixels, each of the plurality of first pixels being in a corresponding first display region of the plurality of first display regions;
a plurality of first reflection members between the first substrate and the plurality of first pixels, each of the plurality of first reflection members being in a corresponding first display region of the first substrate;
a second substrate including a plurality of second display regions and a plurality of second non-display regions, the plurality of second display regions overlapping the plurality of first non-display regions of the first substrate;

a plurality of second pixels, each of the plurality of second pixels being in a corresponding second display region of the plurality of second display regions;

a plurality of second reflection members between the second substrate and the plurality of second pixels, each of the plurality of second reflection members being in a corresponding second display region of the second substrate, wherein:

each first pixel of the plurality of first pixels includes a first display device, and each second pixel of the plurality of second pixels includes a second display device, the first display device includes a first electrode, a first emission layer, and a second electrode sequentially positioned from the first substrate, the second display device includes a third electrode, a second emission layer, and a fourth electrode sequentially positioned from the second substrate, the first emission layer does not overlap with the second emission layer, and the first electrode and the third electrode include a reflection material, and the second electrode and the fourth electrode include a transparent material.

11. The display apparatus as claimed in claim 10, wherein:

each first pixel of the plurality of first pixels includes a first driving circuit between a corresponding first reflection member of the plurality of first reflection members and the first display device, the first driving circuit overlapping the first display device, and each second pixel of the plurality of second pixels includes a second driving circuit between a corresponding second reflection member of the plurality of second reflection members and the second display device, the second driving circuit overlapping the second display device.

12. The display apparatus as claimed in claim 11, further comprising a first insulation layer between a corresponding first reflection member of the plurality of first reflection members and the first driving circuit, and a second insulation layer between a corresponding second reflection member of the plurality of second reflection members and the second driving circuit.

13. The display apparatus as claimed in claim 11, wherein the first electrode of the first display device is electrically connected to the first driving circuit, and the third electrode of the second display device is electrically connected to the second driving circuit.

14. The display apparatus as claimed in claim 10, further comprising a semi-transmission layer on a surface opposite a surface facing at least one of the first pixels and the second pixels of the plurality of first and second pixels from among surfaces of at least one of the first substrate and the second substrate.

15. The display apparatus as claimed in claim 10, further comprising a color filter in at least one of the first non-display regions of the plurality of first non-display regions of the first substrate and the second non-display regions of the plurality of second non-display regions of the second substrate.

16. A display apparatus, comprising:

a first substrate including a first display region and a first non-display region;

a first display device in the first display region of the first substrate;

a first reflection member between the first substrate and the first display device, the first reflection member overlapping the first display device;

a second substrate including a second display region and a second non-display region, the second display region overlapping the first non-display region of the first substrate;

a second display device in the second display region of the second substrate;

a second reflection member between the second substrate and the second display device, the second reflection member overlapping the second display device; and a filling material between the first substrate and the second substrate, the filling material being between the first display device and the second display device, wherein the first display device does not overlap with the second display device.

* * * * *